(12) United States Patent
Goers

(10) Patent No.: US 8,094,300 B2
(45) Date of Patent: Jan. 10, 2012

(54) IN-SITU CONTAMINANT REMOVAL IN OPTICAL PACKAGES

(75) Inventor: Uta-Barbara Goers, Campbell, NY (US)

(73) Assignee: Corning Incorporated, Corning, NY (US)

(*) Notice: Subject to any disclaimer, the term of this patent is extended or adjusted under 35 U.S.C. 154(b) by 614 days.

(21) Appl. No.: 12/260,280

(22) Filed: Oct. 29, 2008

(65) Prior Publication Data

US 2010/0103408 A1 Apr. 29, 2010

(51) Int. Cl.
*G02B 27/32* (2006.01)

(52) U.S. Cl. ................... 356/256; 356/237.1

(58) Field of Classification Search ............ 356/256, 356/237.1–237.5, 73; 250/492.1–492.2, 250/222.2, 559.4; 219/121.6, 121.69, 121.82, 219/121.78–121.79, 121.8; 216/65, 66; 156/345.5, 156/345.24; 134/1.3, 1, 1.2; 438/7, 597
See application file for complete search history.

(56) References Cited

U.S. PATENT DOCUMENTS

| | | | |
|---|---|---|---|
| 4,803,021 A | 2/1989 | Werth et al. | 264/25 |
| 5,669,979 A | 9/1997 | Elliott et al. | 134/1 |
| 6,291,796 B1 | 9/2001 | Lu et al. | 219/121.68 |
| 6,419,996 B2 | 7/2002 | Mueller et al. | 427/554 |
| 6,781,685 B2 | 8/2004 | Hamm | 356/237.1 |
| 6,827,816 B1 | 12/2004 | Uziel et al. | 156/345.39 |
| 2002/0041617 A1 | 4/2002 | Itakura et al. | 372/59 |
| 2003/0227957 A1 | 12/2003 | Pang | 372/59 |
| 2007/0131244 A1 | 6/2007 | Allen | 134/1 |

FOREIGN PATENT DOCUMENTS

| | | |
|---|---|---|
| EP | 0 233 755 | 2/1991 |
| JP | 2002/217416 | 8/2002 |
| WO | 95/07152 | 3/1995 |
| WO | 02/42013 | 5/2002 |

*Primary Examiner* — Tri T Ton
(74) *Attorney, Agent, or Firm* — Svetlana Z. Short

(57) ABSTRACT

A method of controlling an optical package is provided where the average power density of the output beam of the semiconductor laser on the input facet of the wavelength conversion device in a relatively high power wavelength conversion mode exceeds the power density of the output beam of the semiconductor laser on the input facet of the wavelength conversion device in a relatively low power contaminant removal mode. In the relatively high power wavelength conversion mode, the adjustable optical components are utilized to correlate an optimum intensity value of a wavelength-converted output of the wavelength conversion device with optimum coordinates representing the position of the output beam of the semiconductor laser on the waveguide portion of the input facet of the wavelength conversion device. In the relatively low power contaminant removal mode, the adjustable optical components are utilized to scan the output beam of the semiconductor laser across the waveguide portion of the input facet of the wavelength conversion device while maintaining the power density of the output beam on the input facet of the wavelength conversion device below the average power density of the output beam in the relatively high power wavelength conversion mode. Additional embodiments are disclosed and claimed.

19 Claims, 3 Drawing Sheets

IN-SITU CONTAMINANT REMOVAL IN OPTICAL PACKAGES

BACKGROUND OF THE INVENTION

1. Field of the Invention

The present disclosure relates generally to semiconductor lasers, laser controllers, laser projection systems, and other optical systems incorporating semiconductor lasers. More particularly, by way of illustration and not limitation, embodiments of the present disclosure relate generally to optical alignment in packages that include, inter alia, a semiconductor laser and a wavelength conversion device, such as second or third harmonic generation crystal or another type of wavelength conversion device.

2. Technical Background

Short wavelength light sources can be formed by combining a single-wavelength semiconductor laser, such as an infrared or near-infrared distributed feedback (DFB) laser, distributed Bragg reflector (DBR) laser, or Fabry-Perot laser, with a light wavelength conversion device, such as a second harmonic generation (SHG) crystal. The SHG crystal is used to generate higher harmonic waves of the fundamental laser signal. To do so, the lasing wavelength is preferably tuned to the spectral center of the wavelength converting SHG crystal and the output of the laser is preferably aligned with the waveguide portion at the input facet of the wavelength converting crystal.

Waveguide mode diameters of typical wavelength conversion devices, such as MgO-doped periodically poled lithium niobate (PPLN) crystals, can be in the range of a few microns. As a result, it can be very challenging to align the beam from the laser diode with the waveguide of the SHG crystal properly. Accordingly, a variety of adaptive alignment mechanisms have been developed to steer the beam spot of the long wavelength source into proper alignment with the input facet of the waveguide portion of the wavelength conversion device.

SUMMARY OF THE INVENTION

According to one aspect of the present disclosure, a method of controlling an optical package is provided. The optical package comprises a semiconductor laser, a wavelength conversion device, and one or more adjustable optical components configured to optically couple an output beam of the semiconductor laser into a waveguide portion of an input facet of the wavelength conversion device. The optical package is operated in a relatively low power contaminant removal mode and a relatively high power wavelength conversion mode.

In the relatively low power contaminant removal mode, the adjustable optical components are utilized to scan the output beam of the semiconductor laser across the waveguide portion of the input facet of the wavelength conversion device while maintaining the power density of the output beam of the semiconductor laser on the input facet of the wavelength conversion device below the laser power density burn threshold and above the laser power density evaporation threshold. The optical package is operated in the relatively low power contaminant removal mode for an amount of time sufficient to reduce the likelihood of contaminant burning in the waveguide portion of the wavelength conversion device during operation in the relatively high power wavelength conversion mode. In the relatively high power wavelength conversion mode, the power density of the output beam of the semiconductor laser on the input facet of the wavelength conversion device at least periodically exceeds the laser power density burn threshold of the contaminants but burn damage is minimized by utilizing the contaminant removal mode to remove contaminants.

According to another aspect of the present disclosure, a method of controlling an optical package is provided where the average power density of the output beam of the semiconductor laser on the input facet of the wavelength conversion device in the relatively high power wavelength conversion mode exceeds the power density of the output beam of the semiconductor laser on the input facet of the wavelength conversion device in the relatively low power contaminant removal mode. In the relatively high power wavelength conversion mode, the adjustable optical components are utilized to correlate an optimum intensity value of a wavelength-converted output of the wavelength conversion device with optimum coordinates representing the position of the output beam of the semiconductor laser on the waveguide portion of the input facet of the wavelength conversion device. In the relatively low power contaminant removal mode, the adjustable optical components are utilized to scan the output beam of the semiconductor laser across the waveguide portion of the input facet of the wavelength conversion device while maintaining the power density of the output beam on the input facet of the wavelength conversion device below the average power density of the output beam in the relatively high power wavelength conversion mode. The optical package is operated in the relatively low power contaminant removal mode for an amount of time sufficient to evaporate the contaminants.

BRIEF DESCRIPTION OF THE DRAWINGS

The following detailed description of specific embodiments can be best understood when read in conjunction with the following drawings, where like structure is indicated with like reference numerals and in which.

DETAILED DESCRIPTION

Figure 1:
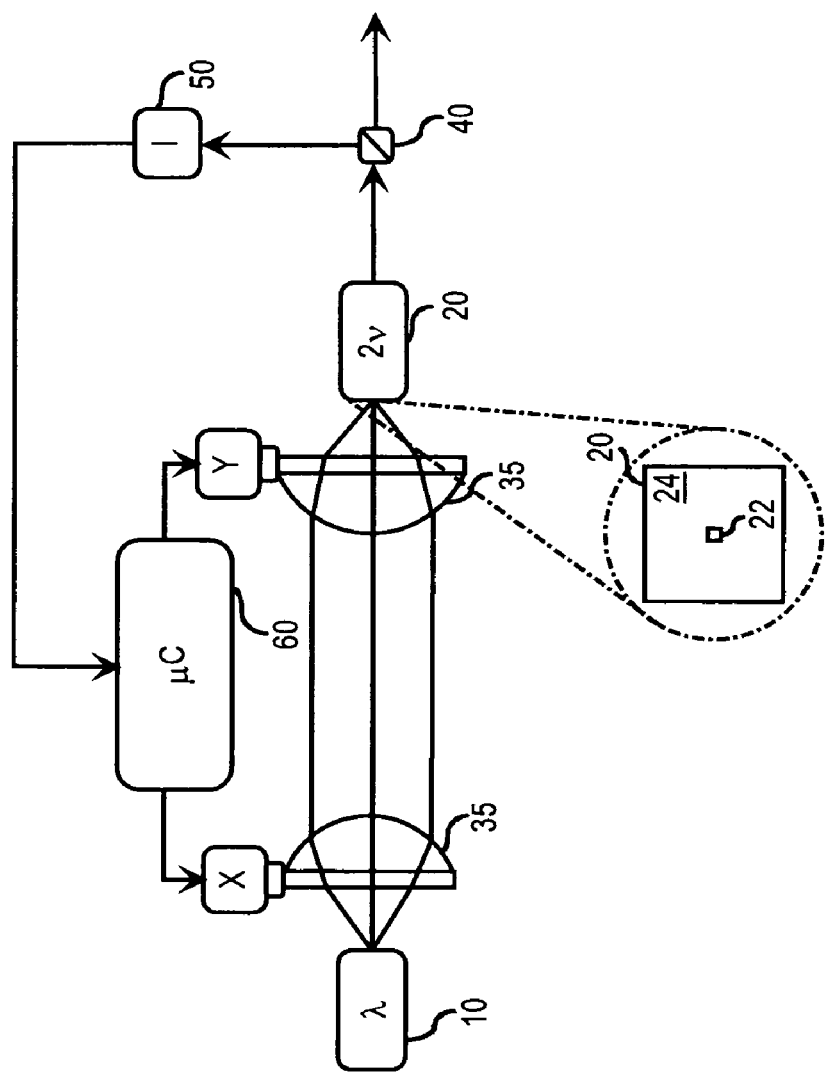
FIG. 1 is a schematic illustration of an optical package comprising a semiconductor laser, a wavelength conversion device, and adjustable optical components in the form of adjustable lenses.

Although the methodology disclosed herein can be described and utilized in a variety of configurations, the optical package illustrated schematically in FIG. 1 provides a convenient reference for illustrating the various aspects of the methodology. Generally, the optical package illustrated in FIG. 1 comprises a semiconductor laser 10, a wavelength conversion device 20, and one or more adjustable optical components that are configured to optically couple an output beam of the semiconductor laser 10 into a waveguide portion 22 of an input facet 24 of the wavelength conversion device 20 (the relative size of the waveguide portion 22 has been exaggerated for clarity). In the illustrated embodiment, the adjustable optical components comprise a pair of lenses 35 that are adjustable in one or more degrees of freedom (X and Y) relative to the optical axis and function to adjust the position of the output beam on the input facet 24. In addition, the illustrated optical package comprises a beam splitter 40, an optical intensity monitor 50, and a programmable controller 60.

Under typical manufacturing and operating conditions, the wavelength conversion device 20 will be subject to particulate contamination. For example, the waveguide portion 22 of the wavelength conversion device 20 may be contaminated with graphite particles or other particulate contaminants on the input facet 24, at an interface of the waveguide portion 22 with an adjoining portion of the wavelength conversion device, or close enough to the input facet 24 to be subject to evaporation in the relatively low power contaminant removal mode. In cases where the waveguide portion 22 comprises Mg-doped periodically poled lithium niobate (PPLN) sandwiched between layers of bulk lithium niobate, contaminants may be present in the epoxy layers used to bond the waveguide portion to the bulk lithium niobate.

The present inventor has recognized that many contaminants, graphite particles being a good example, will exhibit a laser power density burn threshold above which the contaminants are likely to burn when exposed to a laser beam, damaging the waveguide portion 22. Many contaminants also exhibit a lower laser power density evaporation threshold above which the contaminants are likely to evaporate without damaging the waveguide portion 22. Significant contaminant removal occurs at points above the laser power density evaporation threshold, but below the laser power density burn threshold. Applying these recognitions to the operation of an optical package comprising a semiconductor laser 10, a wavelength conversion device 20, and one or more adjustable optical components, the present inventor has recognized that the optical package can be controlled by operating the package in a relatively low power contaminant removal mode and a relatively high power wavelength conversion mode.

In the relatively low power contaminant removal mode, the adjustable optical components are utilized to scan the output beam of the semiconductor laser across the waveguide portion of the input facet of the wavelength conversion device while maintaining the power density of the output beam of the semiconductor laser on the input facet of the wavelength conversion device below the laser power density burn threshold and above the laser power density evaporation threshold. The optical package is operated in the relatively low power contaminant removal mode for an amount of time sufficient to reduce the likelihood of contaminant burning during operation in the relatively high power wavelength conversion mode. In the relatively high power wavelength conversion mode, the power density of the output beam of the semiconductor laser on the input facet of the wavelength conversion device at least periodically exceeds the laser power density burn threshold of the contaminants but burn damage is minimized by utilizing the contaminant removal mode to remove contaminants. The optical package is operated in the relatively low power contaminant removal mode for an amount of time sufficient to reduce the likelihood of contaminant burning during operation in the relatively high power wavelength conversion mode. Preferably, this type of operational sequence is executed through a suitably programmed controller 60.

The optical package can be operated in the relatively low power contaminant removal mode for fractions of a second, multiple seconds, fractions of a minute, or multiple minutes. The optical package can be operated in the relatively low power contaminant removal mode at start-up or intermittently during post start-up operation. The relatively low power contaminant removal mode can be run intermittently between periods of operation in the relatively high power wavelength conversion mode. Typically, because contaminant levels will differ at start-up and during normal operation, the amount of time the optical package is operated in the contaminant removal mode will be a function of whether the contaminant removal mode is initiated at start-up or during post start-up operation.

To optimize contaminant removal in the relatively low power contaminant removal mode, the adjustable optical components can be programmed to scan the output beam of the semiconductor laser 10 across a scanning area that is larger than the waveguide portion of the input facet of the wavelength conversion device but somewhat less than the cross sectional area of the entire input facet 24 of the wavelength conversion device 20. For example, the controller 60 can be programmed such that the scanning area in the relatively low power contaminant removal mode is no more than approximately ten times the cross sectional area of the waveguide portion 22 of the input facet 24. Alternatively, the controller 60 can be programmed such that the scanning area in the relatively low power contaminant removal mode is no more than approximately ½ the cross sectional area of the waveguide portion 22 of the input facet 24. In many cases, the scanning area in the relatively low power contaminant removal mode will typically more closely approximate the cross sectional area of the waveguide portion 22 than the cross sectional area of the entire input facet 24 of the wavelength conversion device 20.

While the power density of the output beam in the relatively high power wavelength conversion mode will typically vary as a function of data encoded in the output beam, the power density of the output beam in the relatively low power contaminant removal mode will be relatively constant. In some cases, the power density of the output beam on the input facet 24 of the wavelength conversion device 20 in the relatively high power wavelength conversion mode is on the order of multiple $MW/cm^2$ or higher, while the power density in the relatively low power contaminant removal mode is on the order of 1 $MW/cm^2$ or less. In many cases, the power density in the relatively high power wavelength conversion mode will be at least approximately five times the power density in the relatively low power contaminant removal mode. In other cases, it may be sufficient to set the power density in the relatively high power wavelength conversion mode such that it exceeds approximately 2 $MW/cm^2$ and to set the power density in the relatively low power contaminant removal mode such that it is less than approximately 2 $MW/cm^2$.

Typically, referring to FIG. 1, in the relatively high power wavelength conversion mode, the intensity of the wavelength-converted output of the wavelength conversion device 20 is monitored using the beam splitter 40 and the intensity monitor 50. The adjustable optical components can be used to correlate optimum values of the monitored intensity with optimum coordinates representing the position of the output beam on the waveguide portion of the input facet 24 of the wavelength conversion device 20.

For the purposes of describing and defining the present invention, it is noted that reference herein to a contaminant being "likely to burn" should be taken as defining a point at which a particle is more likely than not to burn during operation in the relatively high power wavelength conversion mode over the operational lifetime of the optical package. Reference herein to a contaminant being "likely to evaporate" should be taken as defining a point at which a particle is more likely than not to evaporate, as opposed to burn, over the operational lifetime of the optical package. Due to the gradual nature in which the evaporative properties of many materials change with temperature, this point could be a very low threshold and will depend upon the operational preferences and performance specifications of those practicing the present invention. Preferred evaporation times could be on the order of a few minutes, a few seconds, etc.

Regarding the references herein to the "relatively high power wavelength conversion mode" and the "relatively low power contaminant removal mode," it is noted that these powers are recited in this manner to establish that the respective magnitudes are high or low relative to each other and not relative to some other benchmark power level. For example, the phrase "relatively high power wavelength conversion mode" should not be taken to imply that the power of this mode is "high" relative to some other wavelength conversion mode or reference value. Rather, the power of the wavelength conversion mode is "high" relative to the power of the contaminant removal mode.

For the purposes of describing and defining the present invention, it is noted that reference herein to a variable being a "function" of a parameter or another variable is not intended to denote that the variable is exclusively a function of the listed parameter or variable. Rather, reference herein to a variable that is a "function" of a listed parameter is intended to be open ended such that the variable may be a function of a single parameter or a plurality of parameters.

It is noted that recitations herein of a component of the present invention being "configured" to embody a particular property, function in a particular manner, etc., are structural recitations, as opposed to recitations of intended use. More specifically, the references herein to the manner in which a component is "configured" denotes an existing physical condition of the component and, as such, is to be taken as a definite recitation of the structural characteristics of the component.

It is noted that terms like "preferably," "commonly," and "typically" are not utilized herein to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention.

For the purposes of describing and defining the present invention it is noted that the terms "substantially" or "approximately" are utilized herein to represent the inherent degree of uncertainty that may be attributed to any quantitative comparison, value, measurement, or other representation. The terms "substantially" or "approximately" are also utilized herein to represent the degree by which a quantitative representation may vary from a stated reference without resulting in a change in the basic function of the subject matter at issue.

Figure 2:
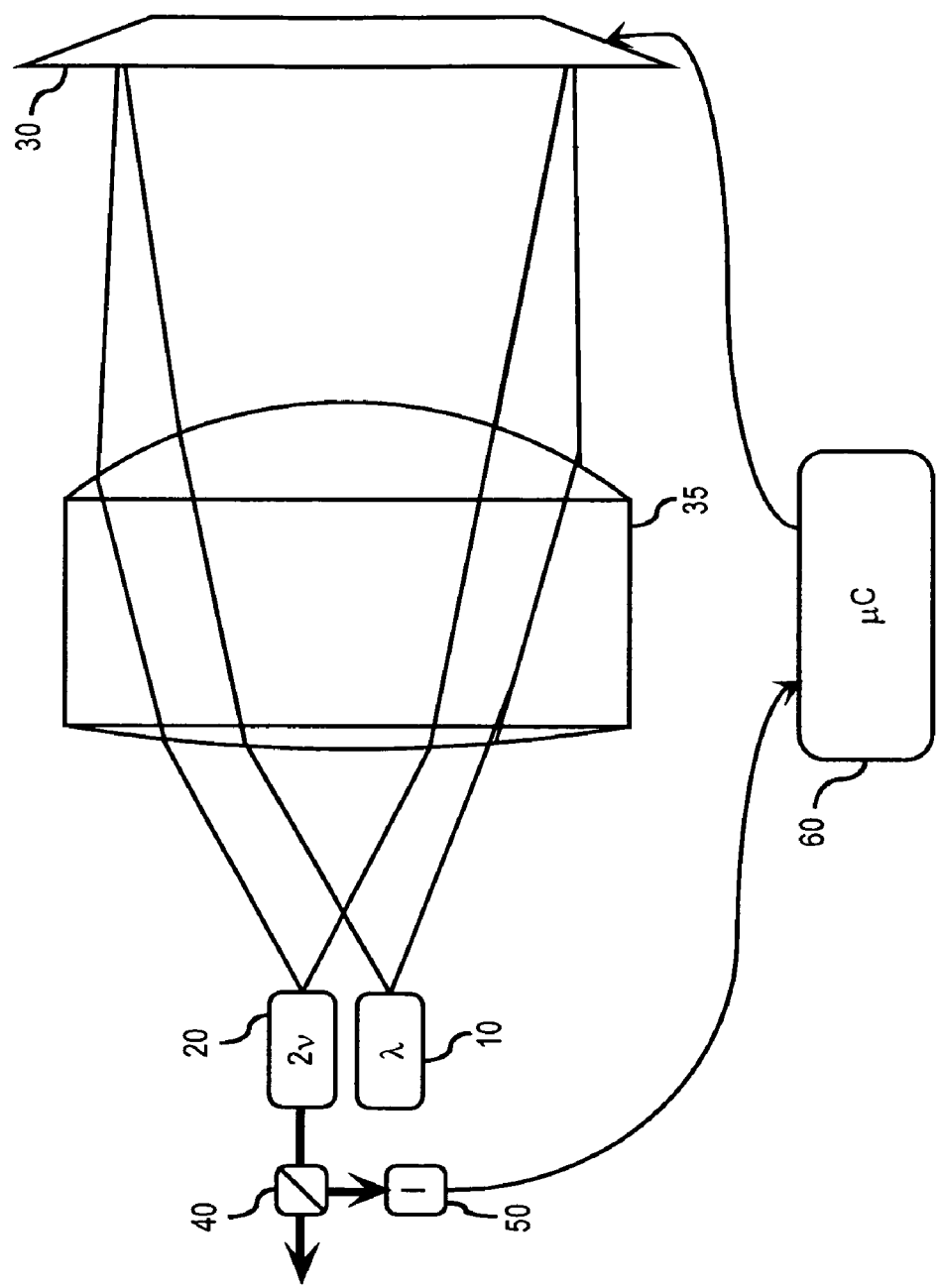
FIG. 2 is a schematic illustration of an optical package comprising a semiconductor laser, a wavelength conversion device, and a MEMS mirror configured in a folded optical configuration.
Figure 3:
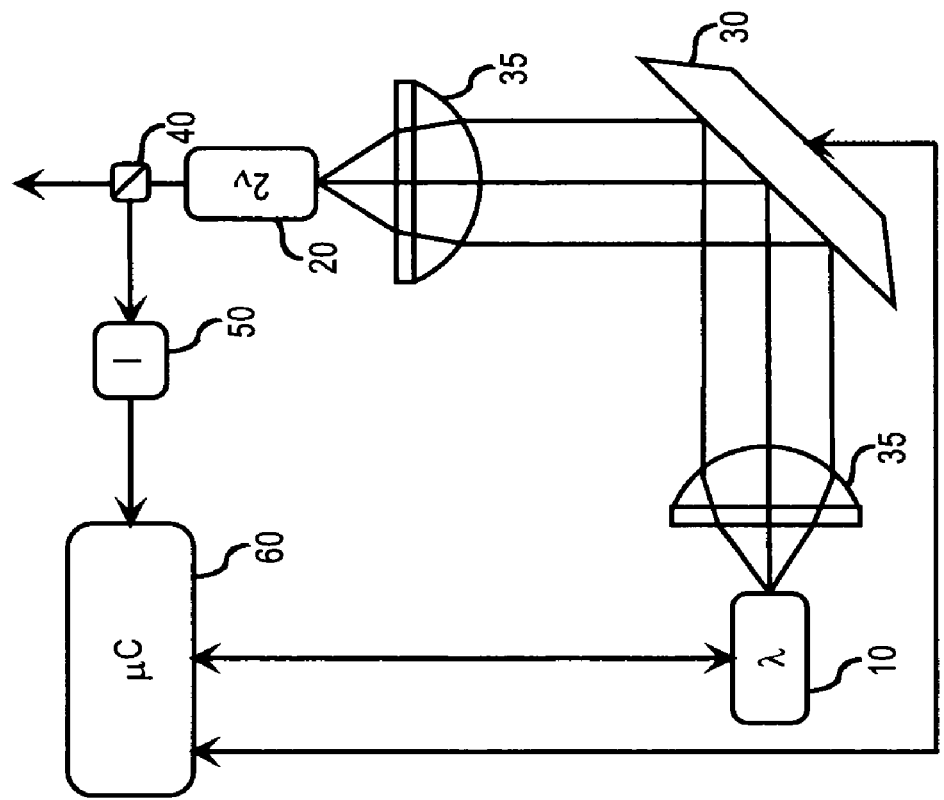
FIG. 3 is a schematic illustration of an optical package comprising a semiconductor laser, a wavelength conversion device, and an adjustable optical component in the form of a MEMS mirror.

Having described the invention in detail and by reference to specific embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention. For example, although the present description refers primarily to the embodiment of FIG. 1, where the adjustable optical components comprise a pair of lenses 35 that are adjustable in one or more degrees of freedom, the concepts presented herein are applicable to a variety of optical configurations including, but not limited to, the configuration of FIG. 2, where a MEMS mirror 30 is positioned in a folded optical configuration employing a single lens component 35 and the configuration of FIG. 3, where a MEMS mirror 30 is provided between a pair of lens components 35.

The invention claimed is:

1. A method of controlling an optical package comprising a semiconductor laser, a wavelength conversion device, one or more adjustable optical components configured to optically couple an output beam of the semiconductor laser into a waveguide portion of an input facet of the wavelength conversion device, the method comprising operation in a relatively low power contaminant removal mode and a relatively high power wavelength conversion mode, wherein:

the waveguide portion of the wavelength conversion device comprises contaminants exhibiting a laser power density burn threshold above which the contaminants are likely to burn and a laser power density evaporation threshold above which the contaminants are likely to evaporate;

in the relatively high power wavelength conversion mode, the power density of the output beam of the semiconductor laser on the input facet of the wavelength conversion device at least periodically exceeds the laser power density burn threshold of the contaminants;

in the relatively low power contaminant removal mode, the adjustable optical components are utilized to scan the output beam of the semiconductor laser across the waveguide portion of the input facet of the wavelength conversion device while maintaining the power density of the output beam of the semiconductor laser on the input facet of the wavelength conversion device below the laser power density burn threshold and above the laser power density evaporation threshold; and the optical package is operated in the relatively low power contaminant removal mode for an amount of time sufficient to reduce the likelihood of contaminant burning in the waveguide portion of the wavelength conversion device during operation in the relatively high power wavelength conversion mode.

2. A method as claimed in claim 1 wherein, in the relatively high power wavelength conversion mode, the method comprises:

monitoring an intensity of a wavelength-converted output of the wavelength conversion device; and utilizing the adjustable optical components to correlate an optimum value of the monitored intensity with optimum coordinates representing the position of the output beam of the semiconductor laser on the waveguide portion of the input facet of the wavelength conversion device.

3. A method as claimed in claim 1 wherein:

the power density of the output beam of the semiconductor laser in the relatively high power wavelength conversion mode varies as a function of data encoded in the output beam; and the power density of the output beam of the semiconductor laser in the relatively low power contaminant removal mode is relatively constant.

4. A method as claimed in claim 1 wherein:

the power density of the output beam of the semiconductor laser on the input facet of the wavelength conversion device in the relatively high power wavelength conversion mode is on the order of multiple $MW/cm^2$ or higher; and the power density of the output beam of the semiconductor laser on the input facet of the wavelength conversion device in the relatively low power contaminant removal mode is on the order of 1 $MW/cm^2$ or less.

5. A method as claimed in claim 1 wherein:
the power density of the output beam of the semiconductor laser on the input facet of the wavelength conversion device in the relatively high power wavelength conversion mode exceeds approximately 5 MW/cm$^2$; and
the power density of the output beam of the semiconductor laser on the input facet of the wavelength conversion device in the relatively low power contaminant removal mode is less than approximately 1 MW/cm$^2$.

6. A method as claimed in claim 1 wherein the power density of the output beam of the semiconductor laser on the input facet of the wavelength conversion device in the relatively high power wavelength conversion mode is at least approximately twice the power density of the output beam of the semiconductor laser on the input facet of the wavelength conversion device in the relatively low power contaminant removal mode.

7. A method as claimed in claim 1 wherein the amount of time the optical package is operated in the relatively low power contaminant removal mode is on the order of fractions of a second, multiple seconds, fractions of a minute, or multiple minutes.

8. A method as claimed in claim 1 wherein optical package is operated in the relatively low power contaminant removal mode intermittently between periods of operation in the relatively high power wavelength conversion mode.

9. A method as claimed in claim 1 wherein optical package is operated in the relatively low power contaminant removal mode at start-up and intermittently during post start-up operation.

10. A method as claimed in claim 1 wherein the amount of time the optical package is operated in the relatively low power contaminant removal mode is a function of whether the contaminant removal mode is initiated at start-up or during post start-up operation.

11. A method as claimed in claim 1 wherein in the relatively low power contaminant removal mode, the adjustable optical components scan the output beam of the semiconductor laser across a scanning area larger than the waveguide portion of the input facet of the wavelength conversion device.

12. A method as claimed in claim 11 wherein the scanning area in the relatively low power contaminant removal mode is no more than approximately ten times the cross sectional area of the waveguide portion of the input facet.

13. A method as claimed in claim 11 wherein the scanning area in the relatively low power contaminant removal mode is no more than approximately ½ the cross sectional area of the waveguide portion of the input facet.

14. A method as claimed in claim 11 wherein the scanning area in the relatively low power contaminant removal mode more closely approximates the cross sectional area of the waveguide portion of the input facet than the cross sectional area of the entire input facet of the wavelength conversion device.

15. A method as claimed in claim 1 wherein the waveguide portion of the wavelength conversion device comprises contaminants at the input facet of the wavelength conversion device.

16. A method as claimed in claim 1 wherein the waveguide portion of the wavelength conversion device comprises contaminants that are close enough to the input facet of the wavelength conversion device to be subject to evaporation in the low power contaminant removal mode.

17. A method as claimed in claim 1 wherein the waveguide portion of the wavelength conversion device comprises contaminants in an epoxy layer positioned between the waveguide portion and an adjoining portion of the wavelength conversion device.

18. A method as claimed in claim 1 wherein the contaminants comprise graphite particles.

19. A method as claimed in claim 1 wherein the adjustable optical components comprise one or more lenses, one or more mirrors, or combinations thereof.

* * * * *